United States Patent [19]
Nassau et al.

[11] Patent Number: 5,882,786
[45] Date of Patent: Mar. 16, 1999

[54] GEMSTONES FORMED OF SILICON CARBIDE WITH DIAMOND COATING

[75] Inventors: Kurt Nassau, Lebanon, N.J.; Thomas G. Coleman, Hillsborough, N.C.; Charles Eric Hunter, Hilton Head Island, S.C.

[73] Assignee: C3, Inc., Morrisville, N.C.

[21] Appl. No.: 751,098

[22] Filed: Nov. 15, 1996

[51] Int. Cl.⁶ .................................................... B32B 9/00
[52] U.S. Cl. ................. 428/336; 63/32; 63/34; 428/408; 428/698; 427/249
[58] Field of Search ................. 501/86; 63/32, 63/34; 428/408, 698, 336; 427/249

[56] References Cited

U.S. PATENT DOCUMENTS

| | | | |
|---|---|---|---|
| 4,301,134 | 11/1981 | Strong | 423/446 |
| 5,015,528 | 5/1991 | Pinneo | 428/403 |
| 5,071,708 | 12/1991 | Komaki et al. | |

FOREIGN PATENT DOCUMENTS

| | | |
|---|---|---|
| 0 305 903 | 3/1989 | European Pat. Off. . |
| 2122528 | 9/1972 | France . |
| 3708171 A1 | 9/1988 | Germany . |
| 1 565 221 | 4/1980 | United Kingdom . |

OTHER PUBLICATIONS

"Applied Physics Letters", Chang et al. (Jun. 28, 1993) pp. 3444–3446. Vol. 62, No. 26.

*Primary Examiner*—Archene Turner
*Attorney, Agent, or Firm*—Richard S. Faust

[57] ABSTRACT

Synthetic gemstones are produced by growing single crystals of silicon carbide, fashioning the silicon carbide into gemstone cores, and thereafter depositing a thin coating of diamond on the core.

21 Claims, 3 Drawing Sheets

GEMSTONES FORMED OF SILICON CARBIDE WITH DIAMOND COATING

FIELD OF THE INVENTION

The invention relates to synthetic gemstones. More particularly, the invention relates to synthetic gemstones formed of a synthetic, transparent, monocrystalline silicon carbide core having a thin coating of diamond deposited thereon.

BACKGROUND OF THE INVENTION

Gemstones Generally

There are a limited number of elements and chemical compounds that have the physical characteristics to be useful as gemstones. The physical characteristics that are generally accepted as being most important are hardness, refractive index and color, although thermal stability, chemical stability and toughness are also considered important in many gemstone applications. To date, the only chemical substances technically considered precious stones are diamond (single crystalline carbon) and corundum (sapphire and ruby [single crystalline aluminum oxide]) because their hardness when measured on the Mohs scale is approximately 9 or higher. The Mohs system is a scale for ranking the hardness of a mineral with diamond being the hardest at 10, sapphire at 9, topaz 8 down to the softest mineral, talc, which is 1. Emerald, because it is rare, is accepted as a precious stone even though its hardness is 7.5 while other gems, such as chrysoberyl, topaz and garnet, are usually classified as semiprecious stones because of their lower hardness. Hardness has practical value in that it defines the ability of a gemstone to resist scratching.

Refractive index is important because it defines the ability of a gemstone to refract light. When materials with a high refractive index are fashioned into finished gemstones they appear brilliant when exposed to light. The characteristic brilliance of a diamond is due mainly to its high refractive index.

The color of a gemstone is determined by a variety of factors, from the impurity atoms that are available to be incorporated into the crystal lattice to the physical and electronic structure of the crystal itself. A ruby, for instance, is simply a sapphire crystal (aluminum oxide) that contains a small concentration of chromium impurity atoms.

The thermal and chemical stability of a gemstone can be important during the process of mounting stones into jewelry. In general, it is beneficial if stones can be heated to high temperatures without changing color or reacting with ambient gases (that mar the surface finish).

The toughness of a gemstone relates to the ability of the gemstone to absorb energy without breaking, chipping or cracking. A gemstone must be able to withstand those impact forces normally encountered during a lifetime of use mounted on a ring or other jewelry item.

Hardness, refractive index, color, thermal/chemical stability and toughness are all characteristics that, in combination, determine the usefulness of a material as a gemstone.

Synthetic Diamond Gemstones

Dating from the 1950s, an effort to produce gem-quality synthetic diamonds was pursued by General Electric Company as evidenced by numerous patents, including U.S. Pat. No. 4,042,673. These efforts centered around the use of very high pressure/high temperature environments for growth of monocrystalline diamonds on seed crystals. Gem-quality synthetic diamonds generally have not gained commercial acceptance.

Synthetic Diamond Films and Coatings

Synthetic diamond films and coatings are now available for certain applications. These films may be grown from the vapor phase by either chemical vapor deposition (CVD) or physical vapor deposition (PVD), with CVD being more prevalent in its use. The deposition of a synthetic diamond film on a substrate using CVD requires an activated gas phase that is activated by high temperature and/or plasma excitation, with the gas phase including a carbon-containing species such as $CH_4$, $CO$, $CO_2$, a hydrocarbon or an alcohol. Since the gas phase so described will tend to deposit both diamond and graphite on the substrate, the gas phase must also include a species such as atomic hydrogen that preferentially etches graphite. The CVD process also requires a substrate surface receptive to nucleation of diamond thereon and a temperature gradient between the gas phase and the substrate to drive the diamond producing species to the substrate.

Commercial uses of diamond films and coatings are largely limited at present to non-electronic application such as abrasives, machine tool coatings, x-ray detection windows, IR optical coatings or elements, and electronic heat sinks.

Synthetic Silicon Carbide Used As Abrasives And Semiconductor Materials

Silicon carbide is rarely found in nature. However, it has been manufactured for more than eighty years, in crystalline form, for abrasive products. Silicon carbide crystals found in nature and in abrasive products are black and not transparent because they contain substantial levels of impurity atoms.

During the 1960s and 1970s, significant development activities were initiated with the objective of growing large (bulk) crystals of low impurity silicon carbide for use in the production of semiconductor devices. These efforts finally resulted in the commercial availability of relatively low impurity, transparent silicon carbide crystals in 1990. These silicon carbide crystals are only fabricated and marketed as very thin, green or blue (175 um–400 um) slices useful for semiconductor devices.

Silicon carbide has a very high hardness (9.25–9.5 Mohs depending on the polytype [atomic arrangement] and crystallographic direction) and a high refractive index (2.5–2.71 depending on the polytype). Furthermore, silicon carbide is a very tough and an extremely stable material that can be heated to more than 2000° F., in air, without suffering damage.

Silicon carbide is a complex material system that forms more than 150 different polytypes, each having different physical and electronic properties. The different polytypes can be classified in three basic forms, cubic, rhombohedral and hexagonal. Both the rhombohedral and hexagonal forms can occur in a number of different atomic arrangements that vary according to atomic stacking sequence.

SUMMARY OF THE INVENTION

The present invention, in one broad aspect, is the discovery that a gemstone having properties very similar to natural diamond may be produced by first growing a single crystal of silicon carbide, fashioning the silicon carbide into a gemstone core, and thereafter depositing a coating of diamond on the core, preferably by chemical vapor deposition. The match between the physical properties of silicon carbide and diamond is ideal for the purposes of the invention. Some of these closely matched physical properties are (I) the chemical compatibility of silicon carbide and diamond as defined, in part, by the chemical composition and surface bond energy of both substances (ii) the closeness of the refractive indices for silicon carbide and diamond (iii) the extreme hardness of both materials (iv) the fact that silicon carbide, like diamond but unlike other diamond substitutes, is not etched by atomic hydrogen or other etching gases typically utilized in diamond coating deposition processes and (v) a match in thermal expansion indices such that the diamond coating will be in compression after deposition.

In carrying out the invention, a single crystal of silicon carbide is grown with desired color characteristics and thereafter cut, faceted and polished into a gemstone core that receives the diamond coating. This silicon carbide core has (I) a hardness of 9.25–9.5, (ii) excellent toughness, (iii) excellent thermal and chemical stability, (iv) a high refractive index, and (v) high dispersion, as well as other properties noted above that closely match it to diamond. According to this aspect of the invention, a single crystal of silicon carbide, preferably of consistent color, is grown by an appropriate technique such as the sublimation technique disclosed in U.S. Pat. No. Re. 34,861. Instead of slicing the large crystal into many thin slices, the crystals serve as boules that are cut into rough synthetic gemstones having a weight on the order of, for example, ¼ to 5 carats. The rough gemstones thereafter are fashioned into the synthetic silicon carbide gemstone cores. The faceting and polishing techniques are derived from those techniques currently used in connection with the faceting and polishing of colored gemstones such as rubies and sapphire, incorporating certain procedures utilized in connection with diamonds. The hardness and toughness of silicon carbide permit the stones to be faceted with very sharp edges, thus enhancing the overall appearance and brilliance of the stones.

Preferably the single crystals of silicon carbide are grown under the same or similar conditions that are used to produce crystals having the low impurity levels necessary for semiconductor applications, with it being appreciated, of course, that higher impurity levels may be permissible within accepted ranges consistent with the need for materials having suitable transparence and other optical properties for gemstone use.

Silicon carbide crystals can be grown in a wide range of colors (including green, blue, red, purple, yellow, and black) and shades within each color by the appropriate selection of dopants (e.g., nitrogen and aluminum) and by varying the net doping densities (concentrations), or by irradiation, for example, using gamma, neutron or electron irradiation to alter the activation of dopants. Undoped silicon carbide crystals in the hexagonal or rhombohedral forms are colorless and meet, or exceed, the brilliance of diamond. One advantage of the invention is that the silicon carbide gemstone core may be produced in any reasonable size customary to the jewelry industry, and may be fashioned to virtually any shape that may of be desired.

Because all relevant physical properties of silicon carbide compare favorably to diamond, particularly hardness and toughness, the silicon carbide gemstone core may be fashioned with sharp edges and other features of typical diamond cuts, and produce a brilliance, fire and clarity similar to that of a natural diamond.

A coating of diamond on the fashioned silicon carbide gemstone core produces a harder surface that resists scratching, abrasion, and other surface deterioration. Furthermore, the gemstone overcomes the inherent susceptibility of diamond to break or crack along a cleavage plane. Because the silicon carbide core does not have cleavage planes it has a much greater ability to absorb impacts without cracking, and this characteristic carries over to the gemstone.

According to the invention, the thickness of the diamond coating will be in the range of about 0.1 to 30 microns, with a preferred thickness range of about 1 to 2 microns, with the understanding that thicker or thinner coatings may be utilized as desired. In this regard, it is known that the consistency and optical uniformity of diamond coatings may be poor in relatively thick coatings. However, coatings in the ranges specified above are relatively thin and are capable of being produced with excellent consistency and optical uniformity.

The present invention permits the color of the gemstone to be carefully controlled. The color and shade of the silicon carbide core may be controlled by selective doping during growth or by irradiation, with the option of many colors or an essentially colorless core. Also the color of the diamond coating may be controlled by selective doping or by irradiation, with a blue color being achieved by boron doping and a yellow color being achieved by nitrogen doping, with others colors, including essentially clear, being options. Thus, many color/shade variations are available for both the silicon carbide core and the diamond coating, resulting in virtually limitless possibilities in terms of combinations for achieving desired effects in the gemstone. For example, both the silicon carbide core and diamond coating may be grown essentially colorless. Any colored core may be covered with an essentially clear diamond coating, with a matching diamond coating or with a coating of a different color that produces a desired effect in combination with the core. For example, complementary colors may be used so that a colored core, after coating, will appear essentially colorless. In this regard, a light green core having a complementary light red coating will appear essentially colorless. Also, the beta polytype of silicon carbide that is cubic has an intrinsic light yellow color and can be coated with a light purple or blue coating to produce a gemstone that is essentially colorless. Because the cubic form of silicon carbide is harder that the other polytypes of silicon carbide, the ability to produce a composite gemstone with a cubic silicon carbide core is desirable.

After completion of fashioning of the silicon carbide core, consideration must be given to a proper preparation of the core surface so that the surface will serve as a suitable nucleation site for the diamond coating. In this regard, a polishing step may be employed to create microscopic roughness by utilizing a diamond polish having a particle size from about 0.5 micron to 5 microns, preferably about 3 microns, so that the nucleation can occur without any intervening etching step. In the alternative, the silicon carbide core may be etched to remove subsurface damage and to provide microscopic roughness to create nucleation sites for diamond. The preferred etching procedures include reactive ion etching, plasma etching and thermal etching, all of which may be performed in the CVD reactor prior to depositing the diamond coating, or sputter etching and molten salt etching that are conducted outside of the CVD reactor.

Reactive ion etching, plasma etching and thermal etching are known gas etching processes that, when tailored to etch the surface of the silicon carbide gemstone core of the invention, are best performed using a fluorine-based etch in an atmosphere of $O_2+CF_4$ or $O_2+SF_6$, or a chlorine-based etch in an atmosphere of $O_2+Cl_2$ or $O_2+HCl$. Reactive ion etching of the core may be carried out at a pressure below 0.2 torr, preferably below 0.1 torr, at a temperature on the order of 30° C. Plasma etching may be carried out at a pressure above 0.2 torr, preferably above 0.5 torr, at a temperature on the order of 30° C. Thermal etching may be carried out at atmospheric pressure (approximately 760 torr) at a temperature between about 500° C. to 1000° C.

Sputter etching of the core may be carried out by using an accelerated ionized inert gas (e.g., argon) that impacts the crown and table of the core so that microscopic roughness is created by abrasive removal of material.

Molten salt etching is an immersion technique wherein the cores are etched in K(OH) or Na(OH) at a temperature in the range of about 250° C. to 600° C. Alternatively, the immersion may be in a K(OH) or Na(OH) solution with water, preferably deionized (DI) water, at the same temperatures.

The table of the silicon carbide gemstone core may be formed parallel to the basal plane of the crystal since this orientation simplifies the production process. However, as is known in the art, growth of an oriented or an epitaxial film on a silicon carbide substrate may be enhanced by an off-axis orientation for the growth surface, in which case the table may be formed off-axis, for example, from 0.2 degrees to 10 degrees off the basal plane, with one degree to 3.5 degrees being preferred.

The silicon carbide gemstone core is preferably oriented so that the table and crown are the carbon face so that the diamond deposition occurs on the carbon face instead of the silicon face, thereby facilitating the initial nucleation and uniformity of the diamond coating, with it being understood that the deposition may also occur on the silicon face, if desired.

In carrying out the invention, it may be desirable to coat only selected surfaces of the silicon carbide core. For example, since the table, crown and bezel of a typical gemstone (FIGS. 3 and 4) receives the bulk of abrasive wear and impact, the coating may be limited to these surfaces. In this regard, the silicon carbide core may be positioned in the CVD reactor with the table directly facing the species vapors, with the crown and bezel also exposed so that the bulk of the diamond deposition occurs on these surfaces with the pavilion being coated substantially less. Where it is desired to coat the pavilion as well, the silicon carbide core may be inverted within the CVD reactor for a second diamond deposition run.

As mentioned above, the methods for depositing thin diamond coatings may be divided into CVD and PVD techniques, both of which may be used in accordance with the present invention.

CVD is the preferred method for this invention. The most preferred CVD method is microwave plasma-enhanced CVD, an example of which will be discussed in detail below. Other CVD methods include the heated filament method, RF plasma-enhanced CVD and DC plasma-enhanced CVD.

Regardless of the deposition method employed, the diamond coating may be deposited while maintaining the substrate, i.e., the silicon carbide gemstone core, at relatively low temperatures in the range of about 400° C. to about 1050° C., with a substrate temperature in the range of about 700° C. to about 900° C. being preferred. At these substrate temperatures the silicon carbide core material is not materially altered. Also, due to the match between the thermal expansion coefficients of silicon carbide and diamond, during the cooling of the gemstone after diamond deposition there is only a small cooling-induced stress at the diamond/silicon carbide interface, with the diamond coating being held in compression on the silicon carbide.

BRIEF DESCRIPTION OF THE DRAWINGS

Some of the objects having been stated, other objects will appear as the description proceeds, when taken in connection with the accompanying drawings, in which.

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Figure 1:
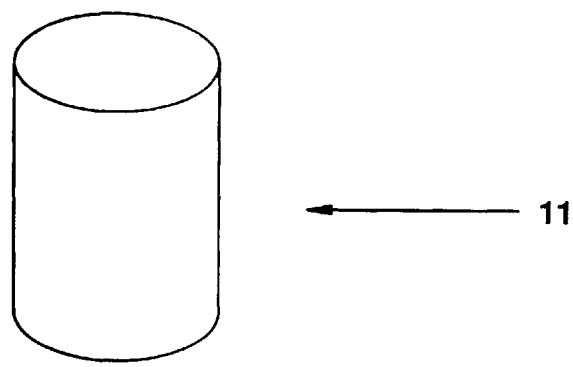
FIG. 1 is a pictorial view of a boule comprising a large single crystal of one polytype of silicon carbide.
Figure 2:
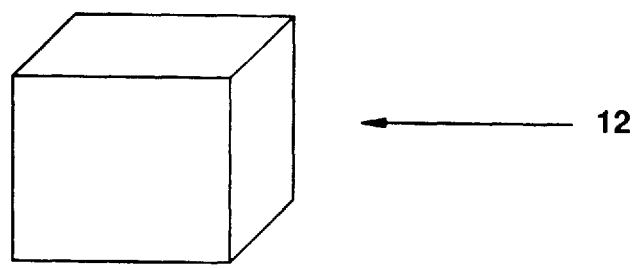
FIG. 2 is an enlarged pictorial view of a rough synthetic gemstone cut from the single crystal of FIG. 1.

Referring to the drawings, FIG. 1 shows a "boule" comprising a large single crystal 11 of silicon carbide that weighs approximately 716 carats and from which approximately 105 five carat rough synthetic gemstones (FIG. 2) may be cut. Each five carat rough gemstone, when fashioned into a gemstone core, will yield an approximate sized gemstone core on the order of two carats, with the understanding that any suitable size gemstone core may be so fashioned. Crystal 11 is substantially cylindrical and measures approximately 44 mm high and 40 mm in diameter. In the preferred manner of practicing the invention, crystal 11 is formed of a single polytype, for example, a hexagonal form such as 6H SiC, and has a low enough impurity level to render the crystal sufficiently transparent for use as a gemstone.

Crystal 11 is grown by an appropriate sublimation or deposition or other growth technique used to grow large (bulk) silicon carbide single crystals, with the preferred method being sublimation growth on a seed crystal. According to this preferred technique, crystal 11 is grown by introducing a polished monocrystalline seed crystal of silicon carbide of a desired polytype into the furnace of a sublimation system along with silicon and carbon containing source gas or powder (source material). The source material is heated to a temperature that causes the source material to create a vapor flux that deposits vaporized Si, $Si_2C$, and $SiC_2$ to the growth surface of the seed crystal. The reproducible growth of a single selected polytype on the seed crystal is achieved by maintaining a constant flux of Si, $Si_2C$ and $SiC_2$, and by controlling the thermal gradient between the source material and the seed crystal. A suitable sublimation growth technique is discussed in U.S. Pat. No. Re. 34,861, incorporated herein by reference.

Crystals grown by sublimation techniques have been used as a material from which very thin slices are taken for use in the production of semiconductor devices. These slices (175 um–400 um) have been green or blue, like the crystal, with the color (and desired electrical properties) achieved by intentionally doping with selected dopants at selected concentrations during the growth process.

Undoped (intrinsic) silicon carbide has not been grown commercially. The extremely low electrical conductivity of undoped silicon carbide would give it no practical value in the fabrication of semiconductor products. However, it has been found that because the hexagonal and rhombohedral polytypes of silicon carbide have wide energy band gaps (>2.7 electron volts) if they are grown undoped (or, equivalently, with a very low level of impurity atoms) the crystals will be colorless. In order to grow undoped, colorless silicon carbide single crystals, the crystal growth system is maintained substantially free of unwanted gaseous or vaporized impurity atoms that would result in unintentional doping of the crystal as it grows utilizing low pressure bake-out techniques as are well known in the art. Preferred polytypes for colorless silicon carbide gemstones are 6H and 4H SiC. The seed for initiating growth of the single crystal for such gemstones is the seed having the same polytype, 6H or 4H SiC respectively.

To create crystals of hexagonal silicon carbide having different colors, one must intentionally add specific impurity atoms. The cubic or 3 C form of silicon carbide, because of its more narrow energy band gap, will appear light yellow when undoped with impurity atoms. Since a large number of different atomic arrangements of silicon carbide exist (any of which can be doped with a number of different dopants in various combinations and concentrations) it is possible to produce gemstones in a wide range of colors and shades. With the 6H polytype, the dopants commonly used are nitrogen (n type) and aluminum (p type) in concentrations typically ranging from a low range on the order of $10_{15}$ carrier atoms per cubic centimeter to a high range on the order of $10_{19}$ carrier atoms per cubic centimeter. Other dopants such as boron may be used at concentrations sufficient to achieve desired colors and shades. The table below gives various atomic arrangements and dopants that produce several representative basic colors.

| Colorless | 6H SiC | Undoped |
|---|---|---|
| Colorless | 4H SiC | Undoped |
| Blue | 6H SiC | Al-doped |
| Purple | 6H SiC | High Al-doped |
| Purple | 24R SiC | N-doped |
| Green | 6H SiC | N-doped |
| Yellow | 3C SiC | Undoped |
| Yellow-Green | 3C SiC | N-doped |
| Red | 27R SiC | N-doped |
| Light Brown | 4H SiC | Low N-doped |
| Yellow-Orange | 8H SiC | N-doped |

Although the above combinations yield a wide variety of colors, all of the crystals have two very important characteristics in common, (1) high hardness and (2) high refractive index. The hardness and refractive index of silicon carbide are compared with other gemstone materials, along with a comparison of density:

| | Mohs Hardness | Refractive Index | Density (SG) |
|---|---|---|---|
| Emerald | 7.5 | 1.59 | 2.5 |
| Corundum (sap & ruby) | 9 | 1.77 | 3.9 |
| Diamond | 10 | 2.42 | 3.5 |
| Silicon Carbide (6H) | 9.25–9.5 | 2.69 | 3.2 |
| Silicon Carbide (4H) | 9.25–9.5 | 2.71 | 3.2 |
| Silicon Carbide (3C) | 9.5 | 2.55 | 3.2 |
| Cubic Zirconia | 7.5 | 1.98 | 4.7 |

As illustrated by the table above, silicon carbide, when produced in certain atomic arrangements with the controlled introduction of specific dopant atoms, is an excellent colored gemstone material that has physical characteristics comparing favorably with, or exceeding, those of corundum and emerald. In its undoped hexagonal and rhombohedral forms, silicon carbide is the best known candidate to replicate the characteristics of diamond.

Fashioning the Silicon Carbide Gemstone Cores

Figure 3:
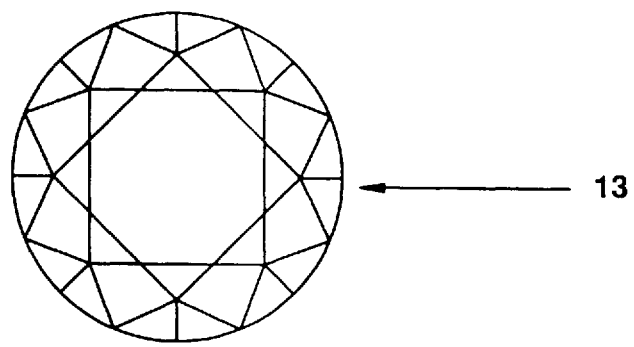
FIG. 3 is an enlarged pictorial view of a finished synthetic silicon carbide gemstone core fashioned from the rough stone of FIG. 2.
Figure 4:
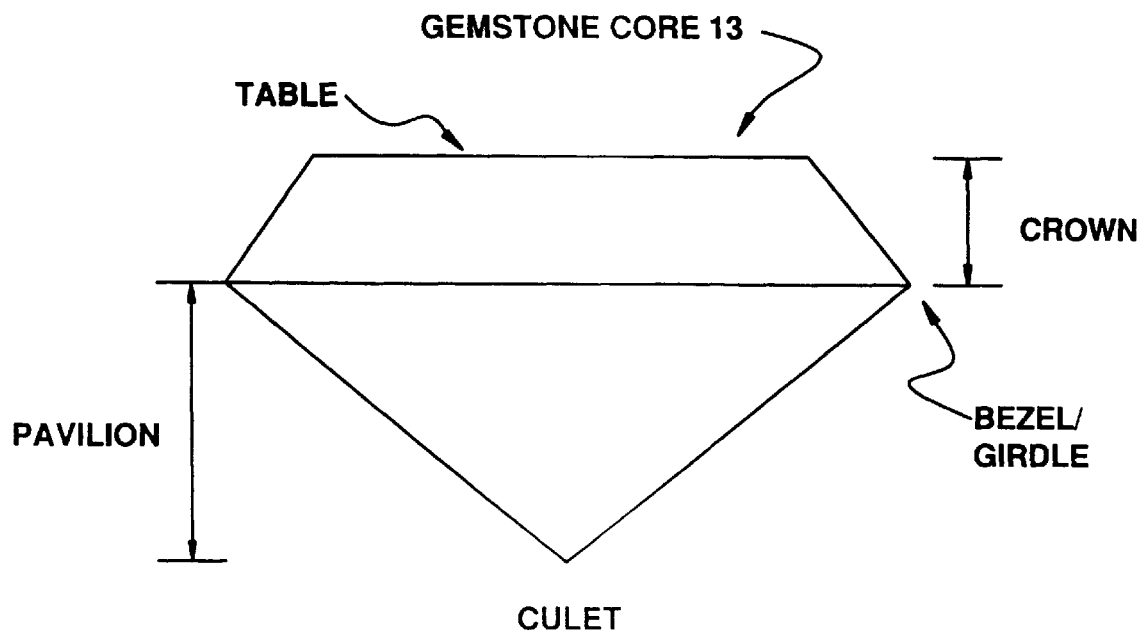
FIG. 4 is a side view of a gemstone core.
Figure 5:
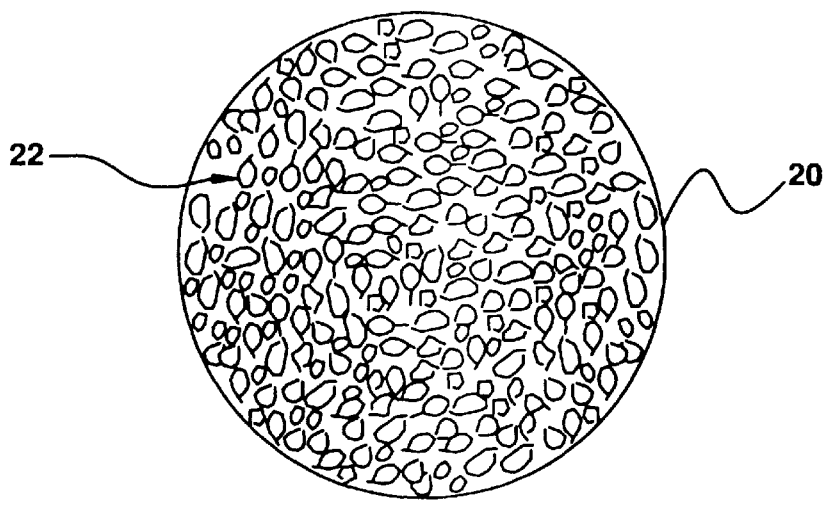
FIG. 5 is a top view of a jig for holding the silicon carbide cores in the CVD reactor.
Figure 6:
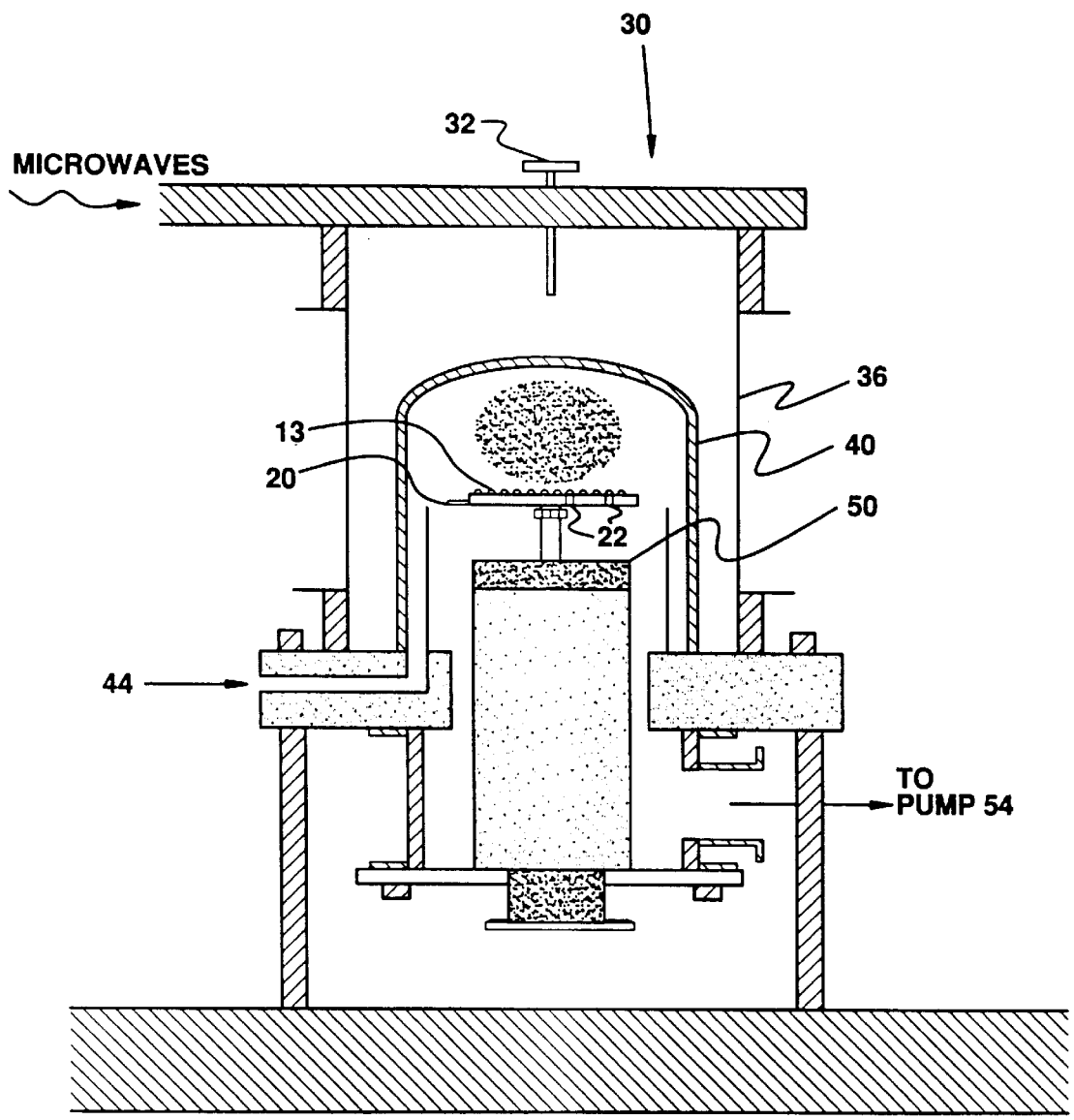
FIG. 6 is a schematic view of one form of CVD reactor used to deposit a coating of diamond on a plurality of silicon carbide gemstone cores.

Referring back to the drawings, the silicon carbide crystal 11 (FIG. 1) of perhaps 716 carats is cut into multiple rough synthetic gemstones 12 (one shown in FIG. 2) having a selected weight, for example, five carats. The rough gemstone 12 preferably has a cubic or approximately cubic shape. In order to produce a finished gemstone core of this invention, as illustrated in FIGS. 3 and 4, it has been found desirable to fashion the rough gemstone 12 into a finished gemstone core according to a novel process that is best suited to taking advantage of the physical characteristics of silicon carbide. This process incorporates faceting techniques that result in precise angles and very sharp edges to take full advantage of the toughness and hardness of the silicon carbide material, while incorporating other techniques more similar to those used on colored stones. A more complete description of the fashioning process will be set forth below following a brief discussion of fashioning, in general, and certain aspects of fashioning colored gemstones such as rubies, sapphires and emeralds.

Fashioning In General (Prior Art)

Gemstone fashioning includes four techniques: faceting, tumbling, cabbing and carving. Faceting produces flat faces (facets) on gems of many different shapes. Transparent and highly transparent gems are normally faceted. Less transparent and opaque materials are usually tumbled, cabbed or carved because the optical properties associated with faceting depend on light reflecting from inside the stone.

A gem's shape is its outline face up, the position in which it is meant to be seen when it is mounted. Shapes other than round are called fancy. Some popular fancy shapes include the well-known emerald cut, cushion, antique cushion, oval, pear, and marquise. Colored stones (and diamonds over three carats) are generally cut into fancy shapes because a lapidary can keep more weight of the original gemstone by utilizing a fancy shape, thus improving the weight yield.

The precise, standardized faceting seen in diamonds is rare in colored stones. One reason is the inability of some colored stones, because of their lower hardness and toughness, to be faceted into sharp angles without breaking or chipping. Another is the difference in what professionals and consumers expect of diamonds versus other stones. "Oriental or native cut" are terms used to describe faceted gems which have distorted shapes and irregularly placed facets and are more common on colored stones. The jewelry industry accepts not perfected faceted colored stones. Most colored stones are faceted just enough to let the light in.

Most faceted gems have three main parts: crown, girdle, and pavilion (FIG. 4). The crown is the top part, the girdle is the narrow section that forms the boundary between the crown and pavilion; it is the gem's setting edge. The pavilion is the bottom. Colored stones usually have facets on the crown as shown in FIG. 3 and on the pavillion.

The Fashioning Process In General For Colored Stones (Prior Art)

The colored gemstone faceter begins by grinding the rough colored gemstone into the approximate shape and dimensions of the finished stone. This is called preforming. Preforming takes a coarse abrasive. Diamond grit embedded in a nickel-plated copper disc is the best choice for preforming very hard colored stones (corundum, chrysoberyl, spinel and silicon carbide).

Water is the wetting agent in preforming and the rest of the faceting sequence. Lapidaries use various arrangements to keep the wheels wet. Preforming roughs in the girdle outline and the general profile of the crown and pavilion, leaving a frosted surface all around the stone. Before grinding in the facets, the lapidary needs to mount the colored stone on a dopstick. The procedure is called dopping. The stone is gently heated, then brought up against the end of the dop, which has been dipped into melted dopping wax. Once the preform has set in position, it is set aside to cool.

The facets of the colored stone are ground and polished on horizontally spinning wheels called laps. Lapidaries use a series of cutting laps with progressively finer grit to grind in the facets, gradually smoothing out their surfaces. Then they do final polishing on a special polishing lap.

Polishing laps are made from a variety of materials. The polishing agents with which these are charged are very finely ground powders, including diamond, corundum, cerium oxide, and polish consistently at the same desired angles, the faceter attaches the dopstick to a device that holds the stone in position as it meets the lap. The traditional setup used in many colored stone shops is the jamb peg. This has a block mounted on a vertical post. The dopstick fits into one of a series of holes on the side of the block. The position of each hole sets a specific angle (from the girdle plane) at which the facet is cut. Turning the dopstick in the hole places all the facets of a given type at the same angle in their circuit around the stone.

The Fashioning Process for Silicon Carbide Gemstone Cores of the Invention

Because the beauty of most diamonds depends on sparkle, brilliance, and fire (not color), diamond cutters must carefully control the cutting factors that affect these characteristics. It is very difficult to put diamond cuts on colored gemstones.

Because the refractive index of silicon carbide is greater than that of diamond and colored stones, according to the present invention the silicon carbide gemstone core is fashioned with precision diamond cuts using diamond hand tools known as tangs. Tangs allow the cutter to set and adjust the angle of the facet, something the cutter is unable to do with colored stone hand tools which are preset. It is the precision of the diamond hand tools, tangs, that enables the cutter to use the angles and proportions of a diamond, resulting in "sharp edges" on the silicon carbide gemstone cores of the invention. However, because silicon carbide is not as hard as diamond, traditional colored stone lap wheels are used in the faceting process at rotational speeds less than those speeds typically used for diamond wheels, i.e., less than 3000 RPM, and preferably at rotational speeds on the order of 300 RPM.

Turning to a more particular description of the silicon carbide fashioning technique of the invention, the silicon carbide rough gemstone is mounted on a dopstick and secured within the top tang. The edge Girdle is cut first on the grinding wheel. This determines the shape of the stone.

The Table, the flat top which is the biggest facet on the whole stone, is cut next also using the top tang. The Table is then polished using a four-step process of laps (disks, wheels or scaifes) progressing from rough to smooth grit sizes. Polishing may begin with a 600 diamond grit lap moving to 1200 grit, then to 3000 grit and ending with a ceramic disk having an effective grit size of 0.5 to 1 micron, which is the smoothest.

The dop is then transferred to a top tang to cut the top side and make the Crosswork which consists of 4 Basics (facets). Then the dop is transferred to a bottom tang and the bottom side is cut into the Crosswork which consists of 4 Basics (facets). At this time, the stone is examined by visual inspection to determine its precision. After this inspection, the 4 lap polishing process outlined for the Table is repeated for the Basics.

The dop is transferred to the top tang and the top side Star facets—there are 8 of these cut along with the Upper Girdle Facets (16 facets), The dop is transferred to the bottom tang and Lower Girdle Facets (16 facets) are cut. The 4 lap polishing process outlined for the Table and Basics is repeated for the remaining Girdle facets. The rough is now a faceted and polished round brilliant gemstone core 13 as shown in FIGS. 3 and 4.

Synthetic Diamond Coating for Silicon Carbide Gemstone Core

The fashioned gemstone core produced by the technique described above is now ready for receiving a diamond coating. First, the core surface preferably is prepared to create microscopic roughness that will facilitate nucleation of the diamond coating. This step may be performed by mechanical polishing or by one of the etching procedures discussed above in the Summary. Examples of depositing the diamond coating follow.

EXAMPLE I

A plurality of gemstone cores, for example about 800 one-quarter carat cores 13, are located on a jig 20 that is then loaded into the CVD reactor 30. Jig 20 may take the form of a circular plate with a diameter of eight inches formed of molybdenum or tungsten, or other suitable material, with the jig having about 800 core-receiving holes 22 therein. In the case of a jig handling gemstone cores as shown in FIGS. 3 and 4, the holes 22 may be circular and somewhat smaller in diameter than the diameter at the bezel, so that the entire table, crown and bezel reside above the jig, while most of the pavilion resides below the jig.

In a preferred manner of practicing the invention, reactor 30 is a microwave plasma-enhanced CVD reactor such as manufactured by Applied Science and Technology, Inc. Reactor 30 includes a microwave antenna 32 that produces a microwave signal in a circular mode. The microwave signal is contained within a metal waveguide 36. The jig 20, holding up to about 800 one-quarter carat gemstone cores 22, is positioned within a silica bell jar 40. The carbon-containing gas (carbon monoxide) and graphite-etching gas (hydrogen) are introduced through a port 44 and form a ball-shaped plasma 46 above jig 20. The surfaces of the gemstone cores are heated to the desired substrate temperature primarily by plate heater 50. A pump 54 assists in maintaining system pressure.

In a representative run, the gas composition that is introduced through port 44 is approximately 0.5% CO diluted in $H_2$ at a flow rate of approximately 275 standard cubic centimeters per minute (sccm). The substrate (core) temperature is approximately 885° C. Total pressure is approximately 2 torr. A run time of 2½ hours produces a diamond coating of approximately 1.5 micron thickness on the table, crown and girdle.

EXAMPLE II

The same CVD system and growth conditions are used as in Example I, with the exception that the 0.5% CO diluted in $H_2$ is replaced with 2% $CH_4$ diluted in $H_2$, and the thickness of the diamond coating after a 2½ hour run is approximately 2.0 microns.

While the two examples utilize a remote microwave plasma system, an immersed microwave plasma system may also be utilized wherein the plasma not only ionizes the gas to produce a plasma, but also heats the jig.

It will be appreciated that the term "diamond coating" and like terms, as used herein, refer to those deposited coatings having diamond or diamond-like crystalline structures suitable to enhance the physical properties of the underlying silicon carbide core. While single crystalline diamond coatings are preferred, oriented diamond coatings and polycrystalline diamond coatings that enhance the physical properties are acceptable. Diamond-like coatings containing amorphous carbon and/or significant hydrogen that enhance the physical properties are also acceptable.

It will be appreciated that terms such as "diamond coating", "diamond film", "diamond thin film", and the like, have at times been used interchangeably herein.

While the invention has been described in connection with certain illustrated embodiments, it will be appreciated that modifications may be made without departing from the true spirit and scope of the invention.

That which is claimed is:

1. A gemstone comprising a core of silicon carbide having a coating of diamond.

2. A gemstone comprising a fashioned core of transparent, monocrystalline, synthetic silicon carbide having a deposited coating of vapor phase-grown diamond.

3. The gemstone of claim 2 wherein both said silicon carbide core and said diamond coating are grown with selected color characteristics so that the gemstone has a desired color and shade.

4. The gemstone of claim 2 wherein said silicon carbide core and said diamond film have complementary colors that together produce an essentially colorless gemstone.

5. The gemstone of claim 4 wherein said silicon carbide core is yellow and said diamond film is purple to blue.

6. The gemstone of claim 2 including an irradiated silicon carbide core having a desired color and shade.

7. The gemstone of claim 6 wherein the gemstone is essentially colorless.

8. The gemstone of claim 2 including an irradiated silicon carbide core and an irradiated diamond coating producing a gemstone of desired color and shade.

9. The gemstone of claim 8 wherein the gemstone is essentially colorless.

10. The gemstone of claim 2 wherein the thickness of the diamond coating is in the range of about 0.1 to about 30 microns.

11. The gemstone of claim 2 wherein the thickness of the diamond coating is in the range of about 1 to 2 microns.

12. The gemstone of claim 2 wherein said silicon carbide core is faceted with diamond-type cuts to create a table, a crown, a bezel and a pavilion, and wherein the diamond coating covers at least the table and crown.

13. The gemstone of claim 12 wherein the table is the carbon face of the silicon carbide core.

14. A method of producing a composite gemstone comprising the steps of producing a gemstone core of synthetic silicon carbide and coating said core with a coating of diamond.

15. A method of producing a composite gemstone comprising:

growing a single crystal of silicon carbide by depositing vapor species containing Si and C on the growth surface of a seed crystal;

producing silicon carbide gemstone cores from the single crystal; and coating the silicon carbide gemstone cores with a coating of diamond.

16. The method of claim 15 wherein said coating step includes the step of growing the diamond coating on at least a portion of the gemstone core by vapor deposition.

17. The method of claim 16 wherein the vapor deposition step is selected from the group consisting of: microwave plasma-enhanced CVD, heated filament CVD, RF plasma-enhanced CVD and DC plasma-enhanced CVD.

18. The method of claim 16 including the step of creating microscopic roughness on the silicon carbide core surface to create nucleation sites for diamond.

19. The method of claim 18 wherein the step of creating microscopic roughness on the core surface comprises utilizing a diamond polish having a particle size in the range from about 0.5 micron to about 5 microns.

20. The method of claim 18 wherein the step of creating microscopic roughness on the core surface comprises an etching process selected from the group consisting of: reactive ion etching, plasma etching, thermal etching, sputter etching and molten salt etching.

21. A method of enhancing a silicon carbide gemstone comprising the step of depositing a coating of diamond on the surface of the silicon carbide gemstone.

* * * * *